(12) United States Patent
Lee et al.

(10) Patent No.: US 9,035,681 B2
(45) Date of Patent: May 19, 2015

(54) SWITCH CONTROLLER, SWITCH CONTROL METHOD, AND POWER SUPPLY DEVICE COMPRISING THE SWITCH CONTROLLER

(71) Applicant: FAIRCHILD KOREA SEMICONDUCTOR LTD., Bucheon (KR)

(72) Inventors: Min-Woo Lee, Bucheon-si (KR); Kyung-Oun Jang, Bucheon-si (KR)

(73) Assignee: Fairchild Korea Semiconductor LTD (KR)

( * ) Notice: Subject to any disclaimer, the term of this patent is extended or adjusted under 35 U.S.C. 154(b) by 0 days.

(21) Appl. No.: 13/886,412

(22) Filed: May 3, 2013

(65) Prior Publication Data

US 2013/0293270 A1 Nov. 7, 2013

(30) Foreign Application Priority Data

May 4, 2012 (KR) .................. 10-2012-0047680

(51) Int. Cl.
| | |
|---|---|
| *H03K 3/00* | (2006.01) |
| *H03K 5/00* | (2006.01) |
| *H02M 3/156* | (2006.01) |
| *H03K 17/082* | (2006.01) |
| *H02M 1/32* | (2007.01) |
| *H02M 1/00* | (2006.01) |
| *G01R 31/02* | (2006.01) |

(52) U.S. Cl.
CPC ............ *H03K 5/00006* (2013.01); *H02M 3/156* (2013.01); *H03K 17/0822* (2013.01); *H02M 1/32* (2013.01); *H02M 2001/0009* (2013.01); *G01R 31/025* (2013.01); *H03K 2217/0027* (2013.01)

(58) Field of Classification Search
None
See application file for complete search history.

(56) References Cited

U.S. PATENT DOCUMENTS

| | | | | |
|---|---|---|---|---|
| 5,335,162 | A * | 8/1994 | Martin-Lopez et al. | ......... 363/97 |
| 6,873,140 | B2 * | 3/2005 | Saggini et al. | ................ 323/283 |
| 7,561,447 | B2 * | 7/2009 | Yang et al. | ................. 363/21.13 |
| 7,760,478 | B2 * | 7/2010 | Yang et al. | ................... 361/93.1 |
| 7,800,927 | B2 * | 9/2010 | Yang | ............................. 363/56.1 |
| 7,936,157 | B2 * | 5/2011 | Kashima | ....................... 323/282 |
| 8,068,354 | B2 * | 11/2011 | Wang et al. | ................ 363/21.09 |
| 8,138,734 | B2 * | 3/2012 | Xi et al. | ......................... 323/284 |
| 8,446,133 | B2 * | 5/2013 | Kuan et al. | ......................... 323/271 |
| 8,508,202 | B2 * | 8/2013 | Cho | .............................. 323/282 |
| 8,593,123 | B2 * | 11/2013 | Chen et al. | ..................... 323/284 |
| 8,780,509 | B2 * | 7/2014 | Wang | .............................. 361/18 |
| 2008/0048630 | A1 * | 2/2008 | Imanaka | ....................... 323/282 |

(Continued)

OTHER PUBLICATIONS

Fairchild Semiconductor, AN-6754A Design Guideline to Replace SG6742 with FAN6754A, Oct. 8, 2010, 9 pages.

(Continued)

*Primary Examiner* — Thomas J Hiltunen
(74) *Attorney, Agent, or Firm* — Grossman Tucker Perreault & Pfleger PLLC (57) ABSTRACT

The present invention relates to a switch controller, a switch control method, and a power supply using the switch controller.

A switch controller controls switching operation of a power switch and receives a sense voltage of a sense resistor to which a drain current flowing in the power switch flows. The switch controller generates a sum signal using the sense voltage and a ramp signal having a cycle that is the same as a switching cycle of the power switch. The switch controller determines short-circuit of the sense resistor by detecting slope variation of the sum signal.

21 Claims, 9 Drawing Sheets

(56) References Cited

U.S. PATENT DOCUMENTS

| | | | |
|---|---|---|---|
| 2009/0128113 A1* | 5/2009 | Ryoo | 323/283 |
| 2009/0256533 A1* | 10/2009 | Wu et al. | 323/224 |
| 2010/0149712 A1* | 6/2010 | Wang et al. | 361/93.2 |
| 2010/0320989 A1 | 12/2010 | Chang et al. | |
| 2012/0033465 A1* | 2/2012 | Lee et al. | 363/53 |
| 2013/0043850 A1* | 2/2013 | Zhu et al. | 323/271 |
| 2013/0135775 A1* | 5/2013 | Yao et al. | 361/18 |
| 2013/0328534 A1* | 12/2013 | Hsieh | 323/271 |
| 2013/0342938 A1* | 12/2013 | Eom et al. | 361/18 |

OTHER PUBLICATIONS

Cypress Semiconductor Corporation, Cypress Perform, AC-DC Controller for Dimmable LED Lighting CY8CLEDAC02, Oct. 26, 2010, 20 pages.

* cited by examiner

SWITCH CONTROLLER, SWITCH CONTROL METHOD, AND POWER SUPPLY DEVICE COMPRISING THE SWITCH CONTROLLER

CROSS-REFERENCE TO RELATED APPLICATION

This application claims priority to and the benefit of Korean Patent Application No. 10-2012-0047680 filed in the Korean Intellectual Property Office on May 4, 2012, the entire contents of which are incorporated herein by reference.

BACKGROUND OF THE INVENTION (a) Field of the Invention

The present invention relates to a switch controller, a switch control method, and a power supply using the switch controller.

(b) Description of the Related Art

A power switch controlling operation of a power supply is connected with a sense resistor for sensing a drain current flowing to the power switch.

In general, a sense voltage generated in the sense resistor and a predetermined reference voltage are compared to sense a short-circuit state of the sense resistor. That is, when the sense voltage is maintained to be lower than the reference voltage for a constant period of time, the sense resistor is determined to be short-circuited.

The reference voltage is set to sense the short-circuit state of the power switch in a switch control IC controlling switching operation of the power switch. However, an error may occur in sensing of the short-circuit state depending on an external set condition to which the switch control IC is applied, that is, an external set condition of the power supply.

For example, the external set condition includes an inductance of an inductor used in the power supply or a VIN voltage supplied to the inductor. In this case, a slope of the sense voltage becomes less steep when the inductance is large or the VIN voltage is low so that the short-circuit state cannot be accurately determined.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a switch controller that can accurately determine a short-circuit state of a sense resistor, a switch control method, and a power supply.

A switch controller according to an exemplary embodiment of the present invention controls switching operation of a power switch and receives a sense voltage of a sense resistor to which a drain current flowing in the power switch flows. The switch controller includes a signal generator generating a sum signal using the sense voltage and a ramp signal having a cycle that is the same as a switching cycle of the power switch and a slope detection unit determining whether the sense resistor is short-circuited by detecting slope variation of the sum signal.

The slope detection unit resets a result of counting a clock signal that controls a switching frequency of the power switch when a negative slope of the sum signal is detected according to a comparison result of the sum signal and a sum delay signal that is a signal delayed by a predetermined delay period from the sum signal.

The slope detection unit generates a protection signal to turn off the power switch when the count result reaches a predetermined threshold value. The slope detection unit includes: a delay unit receiving the sum signal and generating the sum delay signal by delaying the sum signal by the delay period; a comparator generating a count reset signal according to the comparison result of the sum signal and the sum delay signal; and a counter counting the clock signal and resetting the count result by being synchronized by the second pulse of the count reset signal during the maximum duty period of the power switch.

The slope detection unit resets a result of counting of a clock signal that controls switching frequency of the power switch when a negative slope of the sum signal is detected according to a comparison result of a first sum delay signal delayed by a predetermined first delay period from the sum signal and a second sum delay signal delayed by a predetermined second delay period from the sum signal.

The slope detection unit generates a protection signal to turn off the power switch when the count result reaches a predetermined threshold value.

The slope detection unit includes: a first delay unit receiving the sum signal and generating the first sum delay signal by delaying the sum signal by the first delay period; a second delay unit receiving the sum signal and generating the second sum delay signal by delaying the sum signal by the second delay period; a comparator generating a count reset signal according to the comparison result of the first sum delay signal and the second sum delay signal; and a counter counting a clock signal counting a switching frequency of the power switch and resetting the count result by being synchronized by the second pulse of the count reset signal during the maximum duty period of the power switch.

The sum signal generator includes an amplifier amplifying the sense voltage with a predetermined gain and an adder generating the sum signal by adding the amplified sense voltage and the ramp signal.

The switch controller further includes a full-duty detection unit determining whether the present duty of the power switch is full-duty according to a comparison result of the sum delay signal and a predetermined full-duty reference voltage at a predetermined duty threshold time point that corresponds to the maximum duty period of the power switch.

The switch controller further includes a full-duty detection unit determining whether the present duty of the power switch is full-duty according to a comparison result of the sum signal and a predetermined full-duty reference voltage at a predetermined duty threshold time point that corresponds to the maximum duty period of the power switch.

The switch controller further includes a full-duty detection unit determining whether the present duty of the power switch is full-duty according to a comparison result of the sum delay signal and a full-duty reference ramp voltage increasing with a predetermined slope at a predetermined duty threshold time point that corresponds to the maximum duty period of the power switch.

The switch controller further includes a full-duty detection unit determining whether the present duty of the power switch is full-duty according to a comparison result of the sum signal and a full-duty reference ramp voltage increasing with a predetermined slope at a predetermined duty threshold time point that corresponds to the maximum duty period of the power switch.

A switch control method according to another exemplary embodiment of the present invention includes: receiving a sense voltage of a sense resistor to which a drain current flowing in the power switch flows; generating a sum signal using the sense voltage and a ramp signal having a cycle that is the same as a switching cycle of the power switch; and determining whether the sense resistor is short-circuited by detecting slope variation of the sum signal.

The determining whether the sense resistor is short-circuited includes: counting a clock signal that controls a switching frequency of the power switch; detecting a negative slope of the sum signal according to a comparison result of the sum signal and a sum delay signal delayed by a predetermined delay period from the sum signal; resetting the count result when the negative slope is detected; and determining the sense resistor to be short-circuited when the count result reaches a predetermined threshold value.

The detecting the negative slope of the sum signal includes generating a count reset signal according to the comparison result of the sum signal and the sum delay signal and detecting the second pulse of the count reset signal with the negative slope during the maximum duty period of the power switch.

A power supply according to another exemplary embodiment of the present invention includes: a power switch; an inductor connected between the power switch and an input voltage; a sense resistor connected between the power switch and a ground; and a switch controller generating a sum signal using a sense voltage generated in the sense resistor and a ramp signal generated by being synchronized with a clock signal that determines a switching frequency of the power switch, and determining whether the sense resistor is short-circuited by detecting slope variation of the sum signal.

The switch controller resets the result of counting of the clock signal that controls the switching frequency of the power switch when a negative slope of the sum signal is detected according to a comparison result of the sum signal and a sum delay signal delayed by a predetermined delay period from the sum signal.

The switch controller turns off the power switch when the count result reaches a predetermined threshold value.

The switch controller counts the clock signal, and resetting the count result by being synchronized by the second pulse of the count reset signal during the maximum duty period of the power switch.

The switch controller resets the result of counting of the clock signal when a negative slope of the sum signal is detected according to a comparison result of a first sum delay signal delayed by a predetermined first delay period from the sum signal and a second sum delay signal delayed by a predetermined second delay period from the sum signal.

The switch controller turns off the power switch when the count result reaches a predetermined threshold value.

According to the exemplary embodiments of the present invention, a switch controller that can accurately determine a short-circuit state of a sense resistor, a switch control method, and a power supply including the switch controller.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

Hereinafter, a switch controller and a driving method of the switch controller according to an exemplary embodiment of the present invention will be described.

Figure 1:
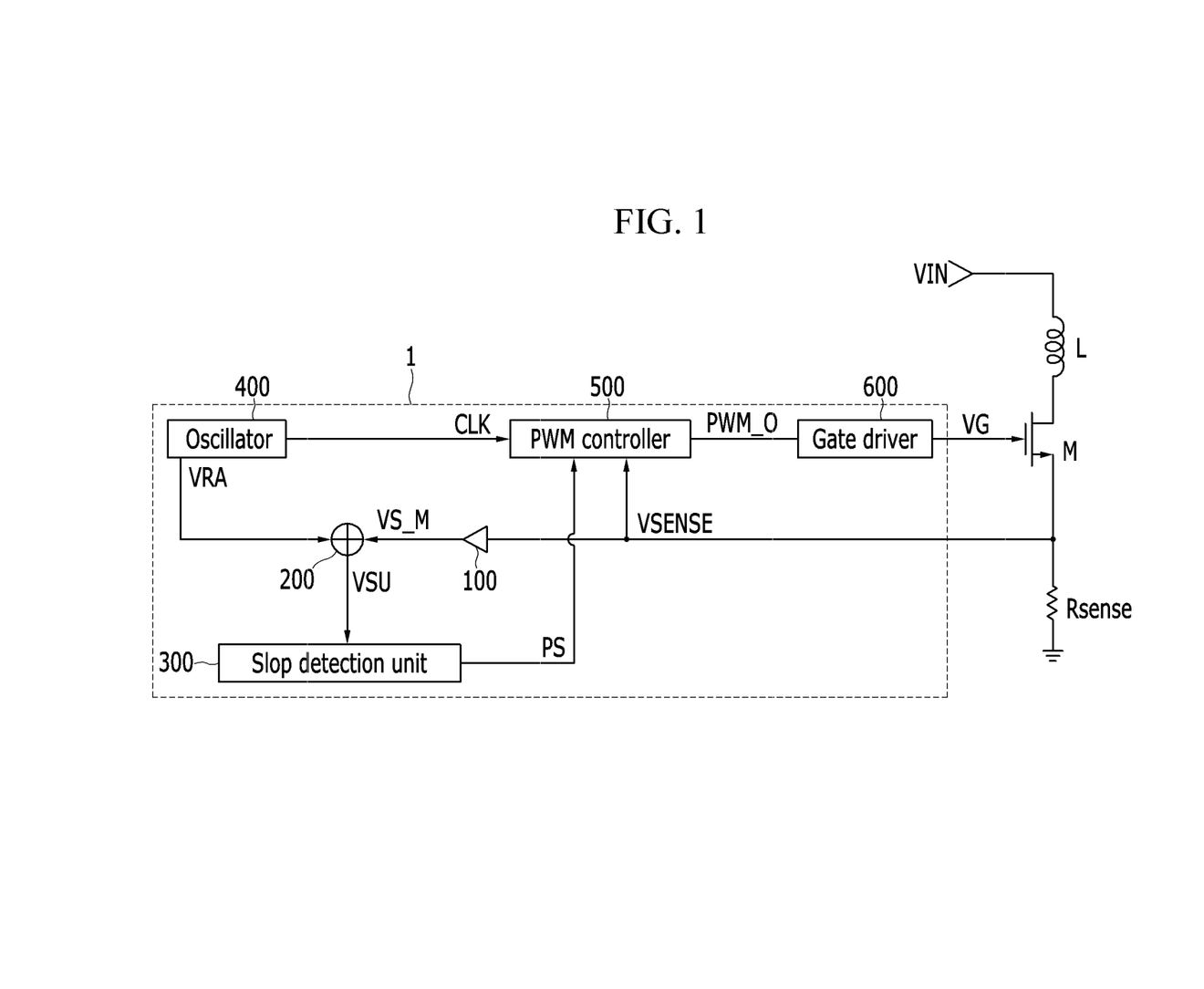
FIG. 1 shows a switch controller according to an exemplary embodiment of the present invention.

FIG. 1 shows a switch controller according to the exemplary embodiment of the present invention.

An inductor L stores energy during a turn-on period of a power switch M and transmits the stored energy to the next stage during a turn-off period of the power switch M. The next stage may be an output terminal connected to the inductor L through a rectification diode, or a secondary side of a transformer.

The power supply may be realized as various types of converters. In the exemplary embodiment of the present invention, as essential constituent elements of the converter, only a power switch and an inductor L storing and transmitting energy according to switching operation of the power switch are illustrated. Thus, the switch controller according to the exemplary embodiment of the present invention can be applied to various types of converters including a circuit shown in FIG. 1.

In FIG. 1, a drain electrode of a power switch M controlled by the switch controller is connected with a first terminal of the inductor L and a source electrode of the power switch M is connected with a first terminal of a sense resistor Rsense.

An input voltage VIN is supplied to a second terminal of the inductor L, and a second terminal of the sense resistor Rsense is connected to a ground. A gate electrode of the power switch M is supplied with a gate voltage VG output from the switch controller 1.

The switch controller 1 generates a clock signal determining a switching frequency and a gate voltage VG that controls the switching operation using a sense voltage VSENSE, and determines short-circuit of the sense resistor Rsense by detecting slope variation of a signal (hereinafter, referred to as a sum signal) VSU that corresponds to the sum of the sense voltage VSENSE and a ramp signal VRA synchronized by the clock signal CLK.

In further detail, the switch controller 1 compares the sum signal VSU with a signal (hereinafter, referred to a sum delay signal) VSU_D that is a signal delayed for a predetermined delay period TD from the sum signal VSU, generates a count reset signal CR according to the comparison result, and may detect a negative slope using the count reset signal CR. Hereinafter, the negative slope of the sum signal VSU implies slope variation occurring due to a decrease of the sum signal VSU, generated when the power switch M is turned off during the maximum duty period.

The switch controller 1 determines that the negative slope is detected when the second pulse of the count reset signal CR is generated during the maximum duty period. The ramp signal VRA is a signal increasing with a predetermined slope during the maximum duty period.

The switch controller 1 counts a clock signal CLK, and the count result is reset at a time point that the negative slope of the sum signal VSU is generated. When the count result exceeds a predetermined threshold value, the sense resistor Rsense is determined to be short-circuited.

In further detail, as shown in FIG. 1, the switch controller 1 includes an amplifier 100, an adder 200, a slope detection unit 300, an oscillator 400, a PWM controller 500, and a gate driver 600.

The amplifier 100 amplifies the sense voltage VSENSE with a predetermined gain. Since an error may occur in slope detection when the sense voltage VSENSE is low, a gate considering a level of the sense voltage VSENSE is multiplied to the sense voltage VSENSE to amplify the sense voltage VSENSE. The amplified sense voltage VSENSE is referred to as an amplification sense voltage VS_M. When the sense voltage VSENSE is efficiently high, the amplifier 100 may not be used.

The adder 200 generates the sum signal VSU by adding the ramp signal VRA and the amplification sense voltage VS_M. In the exemplary embodiment of the present invention, the sum signal is generated by using the amplifier 100 and the adder 200. Accordingly, the amplifier 100 and the adder 200 are referred to as a sum signal generation unit.

The slope detection unit 300 compares the sum signal VSU with the sum delay signal VSU_D delayed by a delay period, detects a negative slope of the sense voltage VS using the comparison result, and resets the count reset of the clock signal CLK when the negative slope is detected. When the negative slope is not detected until the count result reaches the threshold value, the slope detection unit 300 generates a protection signal PS to trigger protection operation.

In a normal state during which the sense resistor Rsense is not short-circuited, a time point that the sum delay signal VSU_D is higher than the sum signal VSU occurs three times during one switching cycle.

Firstly, a period during which the sum delay signal VSU_D is higher than the sum signal VSU occurs after the sense voltage VS is rapidly increased by a peak current flowing at a turn-on time point of the power switch M and then decreased.

Secondly, a period (delay period) during which the sum delay signal VSU_D is higher than the sum signal VSU occurs after the sense voltage VS is decreased due to turn-off of the power switch M. The slope of the sum signal VSI generated at this point is the above-stated negative slope, and when the negative slope is generated during the maximum duty period, the sense resistor Rsense may not be determined to be short-circuited.

Thirdly, the period (i.e., delay period) during which the sum delay signal VSU_D is higher than the sum signal VSU occurs after the maximum duty period (i.e., after the decrease time point of the ramp signal VRA).

The slope detection unit 300 senses a rising edge (or, a falling edge) of the clock signal to count the clock signal, and resets the count result when the negative slope of the sum signal VSU is detected. In further detail, the slope detection unit 300 resets the count result when the second time point that the sum delay signal VSU_D is higher than the sum signal VSU during the maximum duty period occurs.

However, the second decrease time point of the sum signal VSU, that is, when the turn-off time point of the power switch M does not occur during the maximum duty period, the slope detection unit 300 does not reset the count result. When the clock result of clock signal CLK reaches the predetermined threshold value, the slope detection unit 300 generates the protection signal PS to turn off the switching operation of the power switch M.

The oscillator 400 generates the clock signal CLK and the ramp signal VRA. A switching frequency is determined by a frequency of the clock signal CLK, the ramp signal VRS is a signal increasing with a constant slope during the maximum duty period in one switching cycle and has the same cycle of the clock signal.

In the exemplary embodiment of the present invention, the power switch M is turned on by being synchronized with a falling edge of the clock signal CLK, and a low-level period in one cycle of the clock signal CLK may be set to the maximum duty period.

Then, the oscillator 400 may generate the ramp signal VRA increasing with a constant slope during a period (i.e., the maximum duty period) from a falling time point of the clock signal CLK to a rising time point of the clock signal CLK.

The PWM controller 500 turns on the power switch M according to the clock signal CLK, and turns off the power switch M at a time point that the sense voltage VSENSE reaches a predetermined reference voltage. The predetermined reference voltage may be an arbitrary feedback voltage that is changed according to an output voltage of the power supply.

In further detail, by being synchronized at a falling edge time point of the clock signal CLK, the PWM controller 500 generates an enable-level PWM signal PWM_O that turns on the power switch M and transmits the generated signal to the gate driver 600. In addition, by being synchronized at a time point that the sense voltage VSENSE reaches the reference voltage, the PWM controller 500 generates a disable-level PWM signal PWM_O that turns off the power switch M and transmits the generated signal to the gate driver 600.

The gate driver 600 generates the gate voltage VG controlling the switching operation of the power switch M according to the PWM signal PWM_O. Since the power switch M according to the exemplary embodiment of the present invention is an N channel type transistor, the gate driver 600 generates a high-level gate voltage VG according to the enable-level PWM signal PWM_O, and generates a low-level gate voltage VG according to the disable-level PWM signal PWM_O.

Hereinafter, the operation of the switch controller according to the exemplary embodiment of the present invention will be described with reference to FIG. 2.

Figure 2:
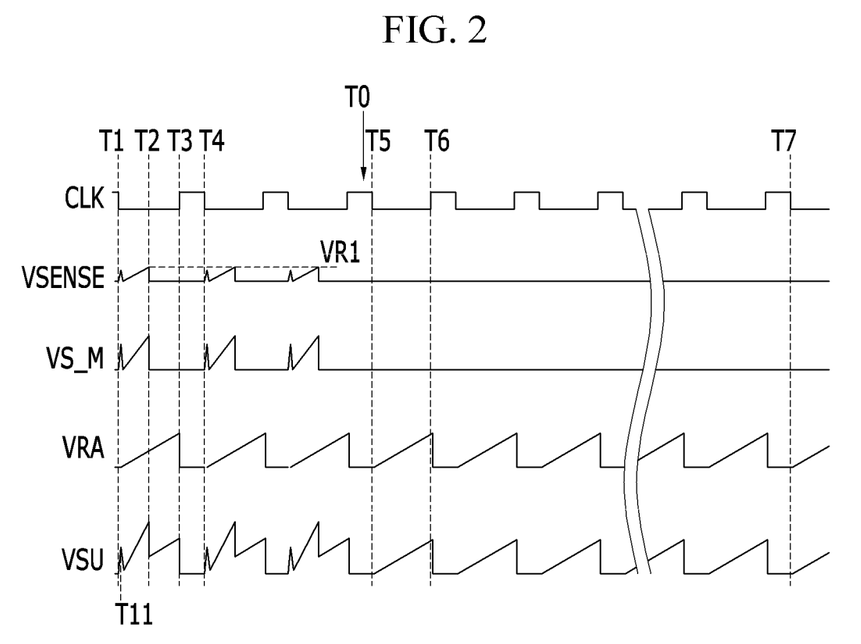
FIG. 2 is a waveform diagram of a signal input to the switch controller and an internal signal according to the exemplary embodiment of the present invention.

FIG. 2 is a waveform diagram of a signal input to the switch controller and an internal signal thereof according to the exemplary embodiment of the present invention. The waveform diagram of FIG. 2 depends on an assumption that the sense resistor Rsense is short-circuited at a time point T0.

As shown in FIG. 2, the clock signal CLK, the ramp signal VRA, and the power switch M have the same switching cycle.

The PWM controller 500 generates an enable-level PWM signal PWM_O to turn on the power switch M at the falling edge of the clock signal CLK. At a time point T1, the power switch M is turned on by being synchronized with the falling edge of the clock signal CLK such that the sense voltage VSENSE is generated and the ramp signal VRA starts to increase.

Since a predetermined-level peak current is generated at the turn-on time point of the power switch M, the sense voltage VSENSE has a peak waveform at the turn-on time point as shown in FIG. 2.

At a time point T2, the sense voltage VSENSE reaches a reference voltage VR1 and the PWM signal PWM_O becomes disable level such that the power switch M is turned off. Thus, the sense voltage VSENSE is decreased at the time point T2, and the amplification sense voltage VS_M has a waveform that corresponds to an amplification of the sense voltage VSENSE during a period T1 to T2 as shown in FIG. 2.

At a time point T3, a rising edge of the clock signal CLK is generated and the ramp signal VRA is reset. The maximum duty period according to the exemplary embodiment of the present invention is a low-level period of the clock signal CLK, and accordingly, the ramp signal VRA is increased during this period.

The sum signal VSU corresponds to the sum of the amplification sense voltage VS_M and the ramp signal VRA, and has a waveform shown in FIG. 2. As shown in FIG. 2, when the sense resistor Rsense is not short-circuited, the sum signal VSU is decreased at a time point T11 that the peak of the turn-on time point of the power switch M is decreased, a turn-off time point T12 of the power switch M, and a decrease time point T3 (i.e., a termination time point of the maximum duty period) of the ramp signal VRA.

At a time point T4, a falling edge of the clock signal CLK is generated and the operation during a period T1 to T3 is repeated.

When the sense resistor Rsense is short-circuited at a time point T0, no sense voltage VSENSE is generated although the power switch M is turned on at the falling edge time point T5 of the clock signal CLK and thus a current flows. Accordingly, the sum signal VSU has a waveform that is the same as that of the ramp signal VRA.

At a time point T6, the rising edge of the clock signal CLK is generated, and the sum signal VSU is increased with a constant slope without the negative slope during the maximum duty period T5 to T6 and decreased at the time point T6.

In the exemplary embodiment of the present invention, the sense resistor Rsense is determined to be short-circuited when the number of times that the negative slope of the sum signal VSU is not generated reaches a predetermined threshold value. In further detail, a cycle of the clock signal CLK is counted, and the count result is reset by the generation of the negative slope of the sum signal VSU during the maximum duty period. The slope detection unit 300 determines the sense resistor Rsense to be short-circuited when the count result reaches the threshold value.

For example, the slope detection unit 300 determines the sense resistor Rsense to be short-circuited when the count result reaches the threshold value at a time point T7, and generates the protection signal PS and transmits the protection signal PS to the PWM controller 500.

Figure 3:
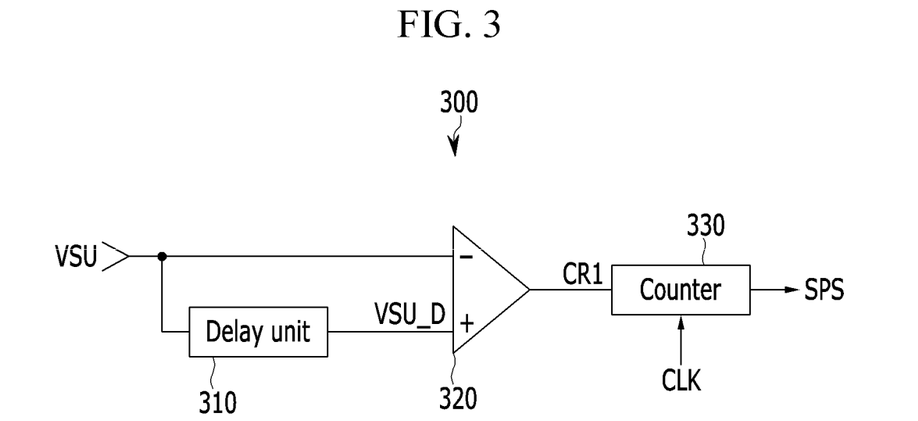
FIG. 3 shows a configuration of a slope detection unit according to the exemplary embodiment of the present invention.

Hereinafter, a configuration of the slope detection unit according to the exemplary embodiment of the present invention will be described with reference to FIG. 3. FIG. 3 shows the configuration of the slope detection unit according to the exemplary embodiment of the present invention.

First, the slope detection unit 300 shown in FIG. 3 includes a delay unit 310, a comparator 320, and a counter 330.

The delay unit 310 delays the sum signal VSU by a delay period TD and outputs a delayed signal.

The comparator 320 compares a signal (i.e., non-inversion input) input to a non-inversion terminal (+) and a signal (i.e., inversion input) input to an inversion terminal (−), and outputs a high-level output when the non-inversion input is higher than the inversion input and outputs a low-level output when the non-inversion input is lower than the inversion input. Hereinafter, an output of the comparator 320 is referred to as a count reset signal CR1.

The sum delay signal VSU_D is input to the non-inversion terminal (+) of the comparator 320, and the sum signal VSU is input to the inversion terminal (+) of the comparator 320. Thus, the comparator 320 outputs a high-level signal when the sum delay signal VSU_D is higher than the sum signal VSU, and outputs a low-level signal when the sum delay signal VSU_D is lower than the sum signal VSU.

The counter 330 outputs a cycle of the clock signal CLK, determines whether the sense resistor Rsense is short-circuited according to the count result, and resets the count result by the count reset signal CR1. In further detail, the counter 330 resets the count result according to the second pulse of the count reset signal CR, generated during one cycle of the clock signal CLK.

Hereinafter, a normal state and a short-circuit state of the sense resistor are respectively described with reference to FIG. 4 and FIG. 5.

Figure 4:
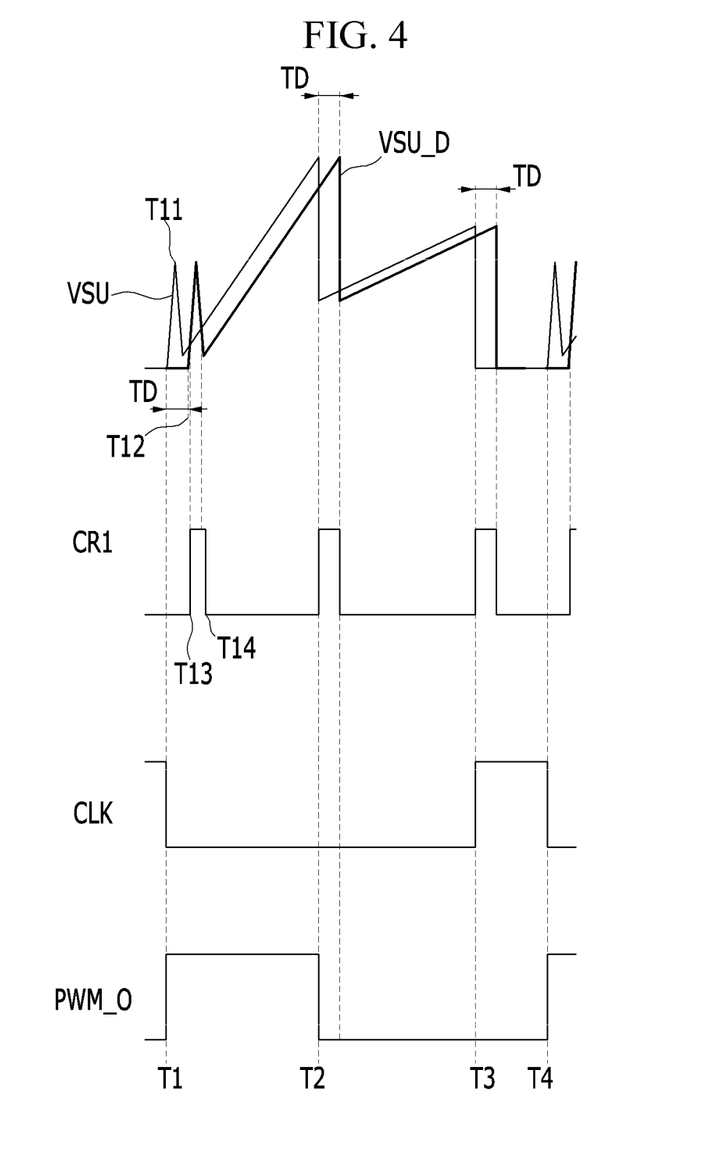
FIG. 4 is a waveform diagram of a sum signal, a sum delay signal, a clock signal, a pulse width modulation signal, and a counter reset signal in a normal state during which a sense resistor is not short-circuited.

FIG. 4 is a waveform diagram of a sum signal, a sum delay signal, a clock signal, a PWM signal, and a counter reset signal in the normal state during which the sense resistor is not short-circuited.

As shown in FIG. 4, at a time point T1, the PWM signal PWM_O is increased by being synchronized at the falling edge of the clock signal CLK and the sum signal VSU is generated. At a time point T12 delayed by the delay period TD from the time point T1, the sum delay signal VSU_D is generated.

At a time point T11, the peak of the sum signal VSU starts to decrease, and at a time point T13, the sum delay signal VSU_D becomes a higher voltage than the sum signal VSU such that the first pulse of the count reset signal CR1 is generated. At a time point T14, the sum signal VSU becomes a higher voltage than the sum delay signal VSU_D such that the count reset signal CR1 becomes low level.

As described, the first pulse of the count reset signal CR1 is generated corresponding to the first decrease of the sum signal VSU during one cycle of the clock signal CLK.

At a time point T2, the PWM signal PWM_O falls to low level, and the negative slope of the sum signal VSU is generated. Since the sum delay signal VSU_D is a higher voltage than the sum signal VSU at the time point T2, the second pulse of the count reset signal CR1 is generated and maintained with a high level during the delay period TD. The counter 330 resets the count result according to the second pulse among pulses of the count reset signal CR1, generated during one cycle of the clock signal CLK.

By being synchronized with the rising edge of the clock signal CLK, generated at a time point T3, the sum signal VSU becomes low level and the sum delay signal VSU_D becomes low level at a time point delayed by the delay period TD from the time point T3. During a period T3 to (T3+TD), the sum delay signal VSU_D is a higher voltage than the sum signal VSU, and therefore the third pulse of the count reset signal CR1 is generated.

When a falling edge of the clock signal CLK is generated at a time point T4, a new cycle of the clock signal CLK is started.

As described, the count result is reset by the second pulse among the three pulses of the count reset signal CR1, generated during one cycle (period T1 to T4) of the clock signal CLK in the normal state. That is, the second pulse of the count reset signal CR1 is generated by being synchronized at the negative slope generation time point.

Figure 5:
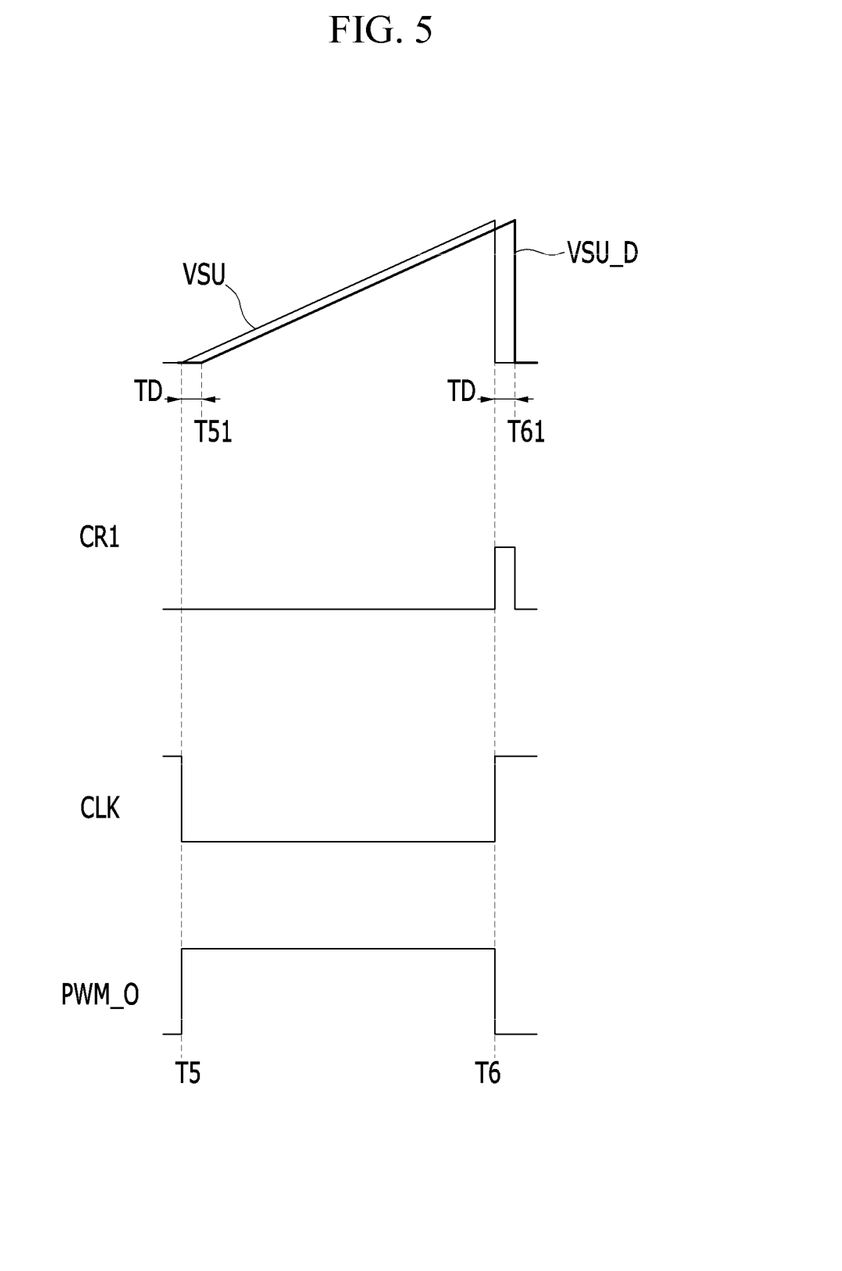
FIG. 5 is a waveform diagram of a sum signal, a sum delay signal, a clock signal, a pulse width modulation signal, and a counter reset signal in a state during which the sense resistor is short-circuited.

FIG. 5 is a waveform diagram of a sum signal, a sum delay signal, a clock signal, a PWM signal, and a count reset signal in the abnormal state during which the sense resistor is short-circuited.

At a time point T5, the falling edge of the clock signal CLK is generated, the PWM signal PWM_O is increased, and the sum signal VSU is generated. Since the sense resistor Rsense is in the short-circuit state, no sense voltage VSENSE is generated.

The sum delay signal VSU_D is generated from a time point T51 delayed by the delay period TD from the time point T5, and the sum delay signal VSU_D is a lower voltage than the sum signal VSU, and thus a pulse of the count reset signal CR1 is not generated.

At a time point T6, the rising edge of the clock signal CLK is generated, the PWM signal PWM_O is decreased, and the sum signal VSU is also decreased. Since the sum delay signal VSU_D is decreased later by the delay period TD, the count reset signal CR1 has a high-level pulse during a period T6 to T61.

However, the pulse during the period T6 to T61 is not the second pulse generated during one cycle of the clock signal CLK, and therefore the count result of the counter 330 is not reset.

In the exemplary embodiment of the present invention, the short-circuit of the sense resistor can be sensed and full-duty can be detected. In further detail, when the sum delay signal VSU_D is higher than a full-duty reference voltage VFR at a time that a full-duty threshold period DTP has elapsed, the duty of the switch controller is determined as full-duty. Alternatively, when the sum delay signal VSU_D is higher than a full-duty reference ramp voltage VFRF at a time that the full-duty threshold period DTP has elapsed, the duty of the switch controller is determined as full-duty.

Figure 6:
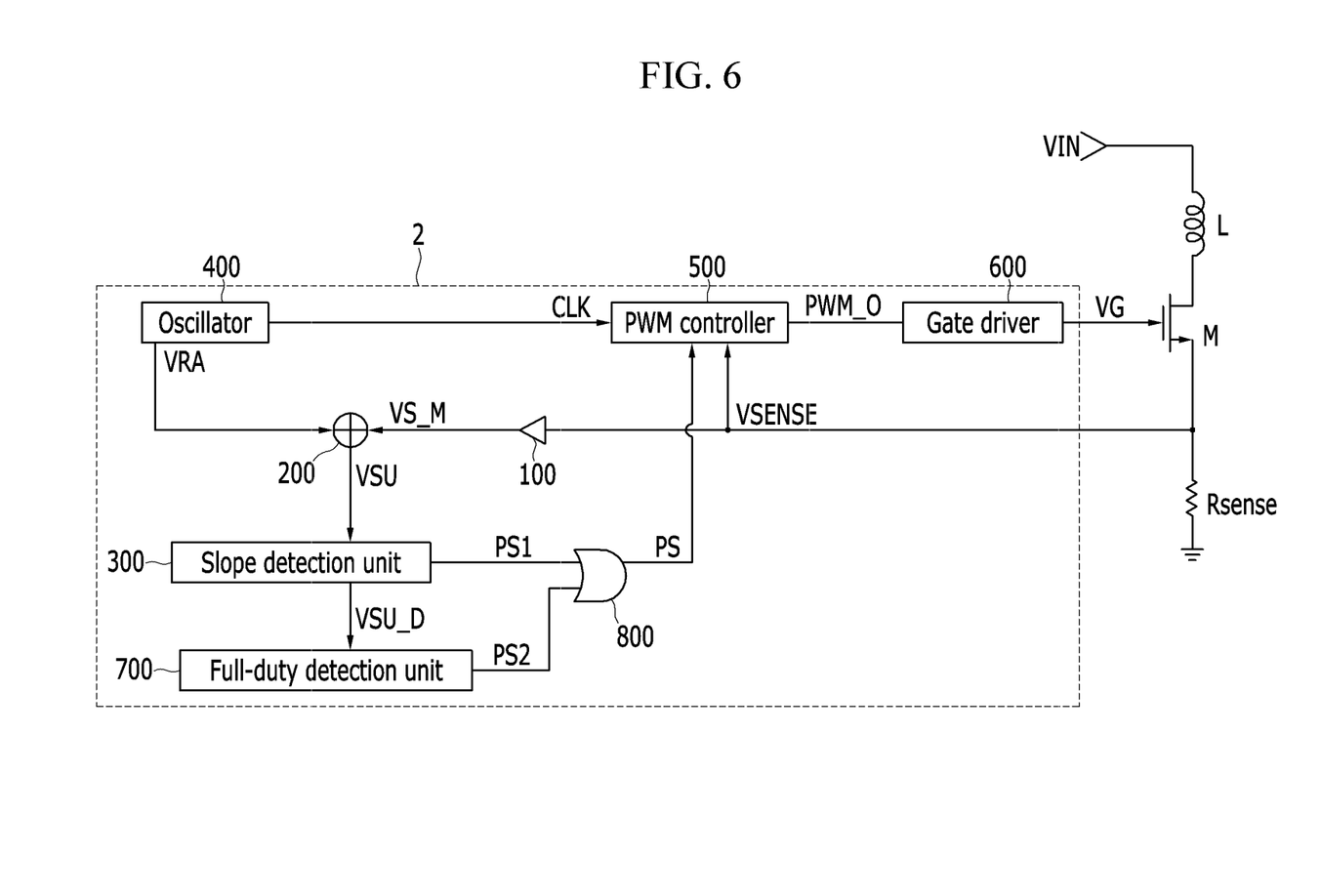
FIG. 6 shows a switch controller according to another exemplary embodiment of the present invention.

FIG. 6 shows a switch controller according to another exemplary embodiment of the present invention. As shown in FIG. 6, a switch controller 2 further includes a full-duty detection unit 700 and a logic gate 800 in addition to the constituent elements of the switch controller according to the previous exemplary embodiment. Other constituent elements of the switch controller 2 are the same as those of the previous exemplary embodiment, and therefore no further description will be provided.

The logic gate 800 generates a protection signal PS by performing OR operation on a protection signal (hereinafter, a first protection signal) PS1 generated from a slope detection unit 300 and a second protection signal PS2 generated from a full-duty detection unit 700. Thus, when at least one of the first protection signal PS1 and the second protection signal PS2 is generated, switching operation of the power switch M is stopped by the protection signal PS.

The full-duty detection unit 700 generates a comparison pulse signal according to a comparison result of the sum delay signal VSU_D and the full-duty reference voltage VFR, and determines a duty of the present power switch M as full-duty when a comparison pulse signal at a time that the full-duty threshold period DTP has elapsed (hereinafter, a duty threshold time point) is first level (e.g., high level).

Figure 7:
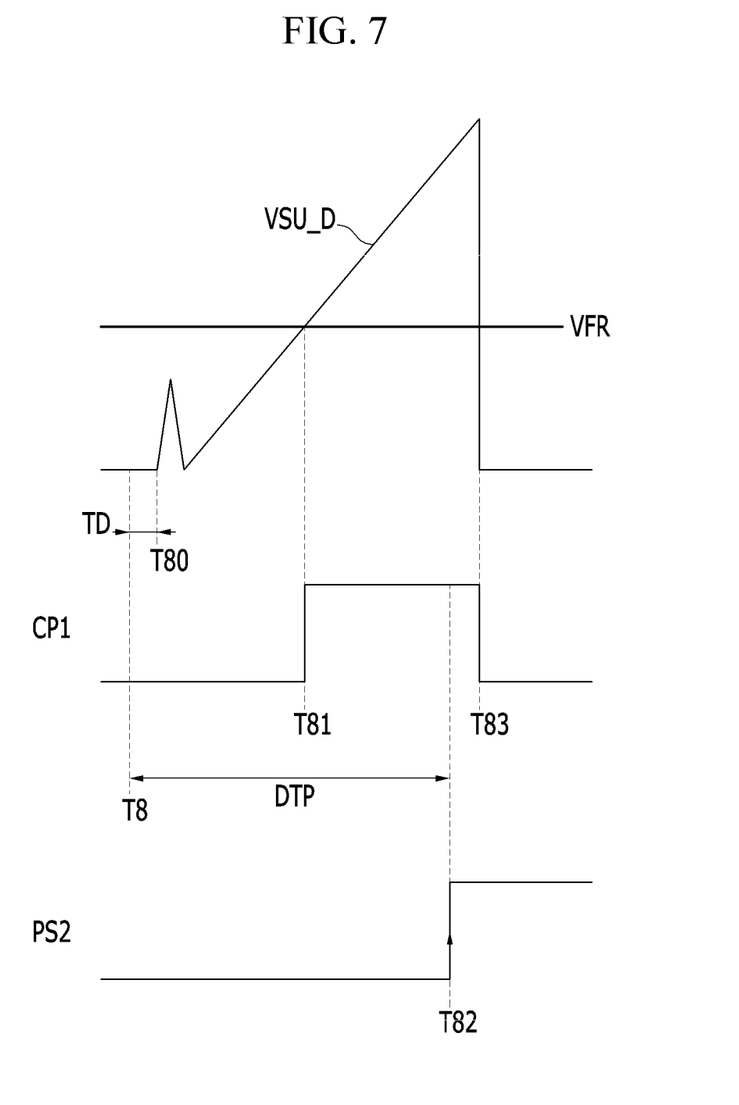
FIG. 7 is a waveform diagram of a pull-duty reference voltage, a sum signal, a comparison pulse signal, and a second protection signal.

FIG. 7 is a waveform diagram of the full-duty reference voltage, the sum delay signal VSU_D, the comparison pulse signal, and the second protection signal. FIG. 7 is a waveform diagram of signals generated in the full-duty condition.

As shown in FIG. 7, the power switch M is turned on at a time point T8, and the sum delay signal VSU_D is generated at a time point T80 that is delayed by the delay period TD from the time point T8. At a time point T81, the sum delay signal VSU_D reaches the full-duty reference voltage VFR such that a comparison pulse signal CP1 is increased to high level.

When the comparison pulse signal CP1 is high level at a duty threshold time point T82 that is a time that the full-duty threshold period DTP has elapsed from the time point T8, the full-duty detection unit 700 determined the present duty of the power switch M as full-duty, and generates a high-level second protection signal PS2.

A full-duty reference ramp voltage may be used instead of using the full-duty reference voltage of FIG. 7.

Figure 8:
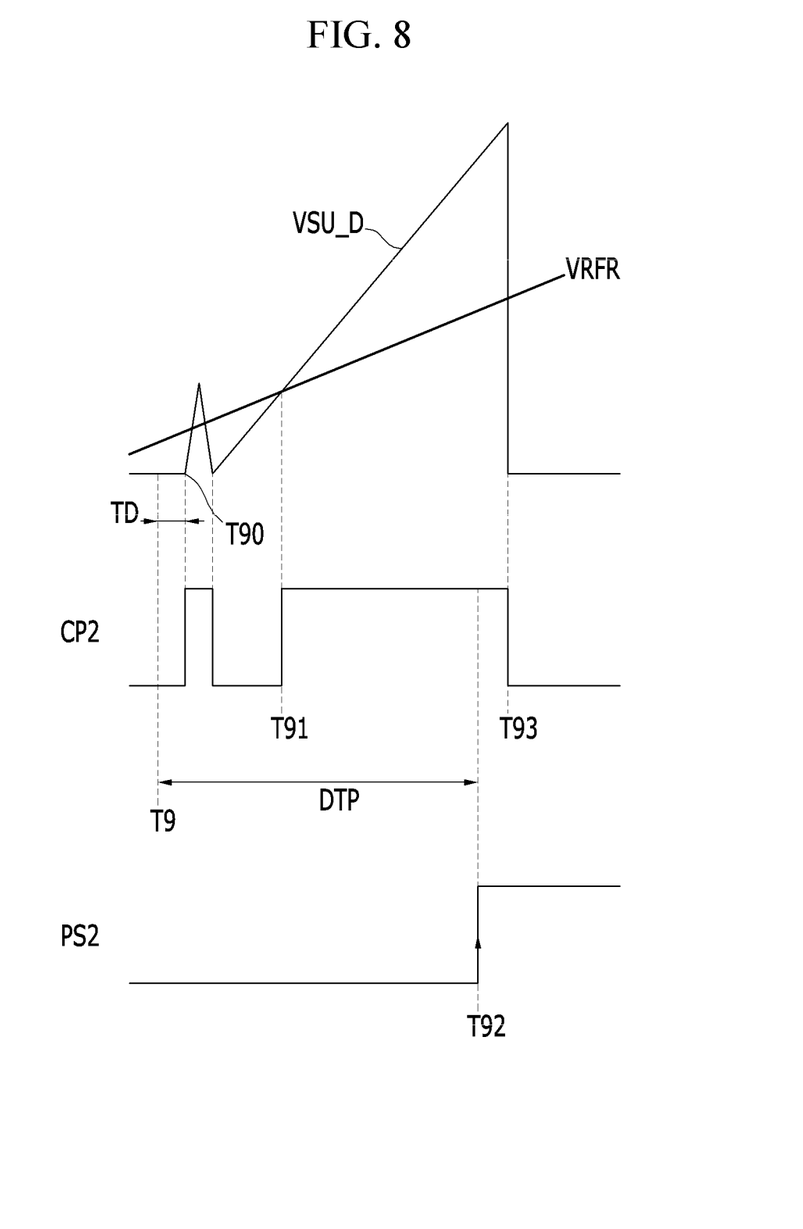
FIG. 8 is a waveform diagram of a pull-duty reference ramp voltage, a sum signal, a comparison pulse signal, and a second protection signal.

FIG. 8 is a waveform diagram of the full-duty reference ramp voltage, the sum delay signal VSU_D, the comparison pulse signal, and the second protection signal. The waveform diagram of FIG. 8 also illustrates signals generated in the full-duty condition.

As shown in FIG. 8, the power switch M is turned on at a time point T9, and the sum delay signal VSU_D is generated at a time point T90 that is a time delayed by the delay period TD from the time point T9. At a time point T91, the sum delay signal VSU_D reaches the full-duty reference ramp voltage VRFR such that a comparison pulse signal CP2 is increased.

When the comparison pulse signal CP2 is high level at a time point T92 that is a time that the full-duty threshold period DTP has elapsed from the time point T9, the full-duty detection unit 700 determines the present duty of the power switch M as full-duty and generates a high-level second protection signal PS2.

The full-duty threshold period DTP may be set to a period that is substantially the same as the maximum duty period.

Alternatively, the full-duty threshold period may be set to a period that is shorter by a predetermined margin than the maximum duty period. In this case, a sum signal may be used instead of the sum delay signal. That is, when the sum signal is higher than the full-duty reference voltage or the full-duty reference voltage at a termination time point of the full-duty threshold period, the duty of the switch is determined as full-duty.

In the exemplary embodiment of the present invention, the slope detection unit 300 includes a single delay unit, but the present invention is not limited thereto.

Figure 9:
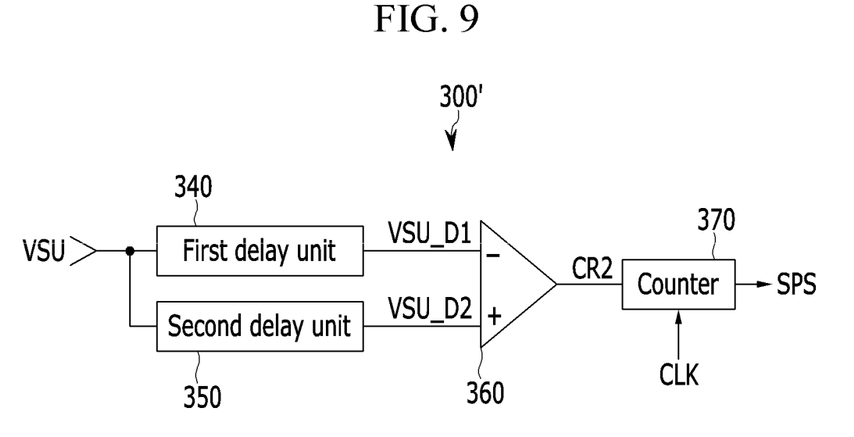
FIG. 9 is an exemplary variation of a slope detection unit according to another exemplary embodiment of the present invention.

FIG. 9 is exemplary variation of a slope detection unit according to another exemplary embodiment of the present invention.

As shown in FIG. 9, a slope detection unit 300' includes a first delay unit 340, a second delay unit 350, a comparator 360, and a counter 370. Operations of the comparator 360 and the counter 370 are the same as those of the comparator 320 and the counter 330 of the previous exemplary embodiment, and therefore no further description will be provided.

The first delay unit 340 generates a first sum delay signal VSU_D1 by delaying the sum signal VSU by a first delay period TD1, and generates a second sum delay signal VSU_D2 by delaying the sum signal VSU by a second delay period TD2. The first delay period TD1 is longer than the second delay period TD2.

When the second sum delay signal VSU_D2 input to a non-inversion terminal (+) is higher than the first sum delay signal VSU_D1 input to an inversion terminal (−), the comparator 360 outputs a high-level output, and outputs a low-level output in the opposite case.

In the normal state, the counter 370 is reset by the second pulse of a count reset signal CR2, generated at the second time point that the second sum delay signal VSU_D2 has a higher voltage than the first sum delay signal VSU_D1 during one cycle of the clock signal CLK. That is, the count result is reset by being synchronized at a negative slope detection time point of the sum signal VSU.

In a state that the sense resistor Rsense is short-circuited, the second pulse of the count reset signal CR2 is not generated during one cycle of the clock signal CLK, and accordingly the counter 370 is not reset.

When the slope detection unit 300' of the other exemplary embodiment of the present invention is applied to the exemplary embodiment shown in FIG. 6, the full-duty detection unit 700 may use one of the first sum delay signal VSU_D1 and the second sum delay signal VSU_D2.

A sum signal may include noise, and when the sum signal including noise passes through the delay unit, the noise is reduced. According to another exemplary embodiment of the present invention, two delay units may be included to further reduce possibility of malfunction of a comparator due to noise.

The switch controller that detects short-circuit and full-duty of a sense resistor using a sum signal generated by adding a sense voltage and a ramp signal has been described. While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS switch controller 1, amplifier 100, adder 200, slope detection unit 300 oscillator 400, PWM controller 500, gate driver 600, power switch M inductor L, sense resistor Rsense, delay unit 310, first delay unit 340 Second delay unit 350, comparator 320 and 360, counter 330 and 370 Full-duty detection unit 700, logic gate 800

What is claimed is:

1. A switch controller for controlling switching operation of a power switch and receiving a sense voltage, of a sense resistor, based on a drain current flowing in the power switch, the switch controller comprising:
    signal generator circuitry configured to generate a sum signal based on the sense voltage and a ramp signal, wherein the ramp signal has a cycle that is approximately the same as a switching cycle of the power switch; and
    slope detection circuitry configured to determine a short circuit condition of the sense resistor by detecting a slope variation of the sum signal;
    wherein the slope detection circuitry is further configured to detect a negative slope of the sum signal based on the sum signal and at least one sum delay signal, wherein the at least one sum delay signal has at least one predetermined delay period from the sum signal.

2. The switch controller of claim 1, wherein the slope detection circuitry is further configured to reset a counting result of a clock signal that controls the switching frequency of the power switch when the negative slope of the sum signal is detected.

3. The switch controller of claim 2, wherein the slope detection circuitry is further configured to generate a protection signal to turn off the power switch when the counting result reaches a predetermined threshold value.

4. The switch controller of claim 3, wherein the slope detection circuitry comprises:
    delay circuitry configured to receive the sum signal and generate the sum delay signal by delaying the sum signal by the predetermined delay period;
    comparator circuitry configured to generate a count reset signal based on the sum signal and the sum delay signal; and
    counter circuitry configured to count the clock signal and reset the count result based on a second pulse of the count reset signal during a maximum duty period of the power switch.

5. The switch controller of claim 1, wherein the slope detection circuitry is further configured to reset the counting result of the clock signal that controls switching frequency of the power switch when the negative slope of the sum signal is determined based on a first sum delay signal delayed by a predetermined first delay period from the sum signal and a second sum delay signal delayed by a predetermined second delay period from the sum signal.

6. The switch controller of claim 5, wherein the slope detection circuitry is further configured to generate a protection signal to turn off the power switch when the counting result reaches a predetermined threshold value.

7. The switch controller of claim 6, wherein the slope detection circuitry comprises:
    first delay circuitry configured to receive the sum signal and generate the first sum delay signal by delaying the sum signal by the first delay period;
    second delay circuitry configured to receive the sum signal and generate the second sum delay signal by delaying the sum signal by the second delay period;
    comparator circuitry configured to generate a count reset signal based on the first sum delay signal and the second sum delay signal; and
    counter circuitry configured to count the clock signal counting a switching frequency of the power switch and reset the count result based on a second pulse of the count reset signal during the maximum duty period of the power switch.

8. The switch controller of claim 1, wherein the signal generator circuitry comprises:
    amplifier circuitry configured to amplify the sense voltage with a predetermined gain, and
    adder circuitry configured to generate the sum signal by adding the amplified sense voltage and the ramp signal.

9. The switch controller of claim 1, further comprising full-duty detection circuitry configured to determine whether a present duty of the power switch is full-duty based on the sum delay signal and a predetermined full-duty reference voltage at a predetermined duty threshold time point that corresponds to a maximum duty period of the power switch.

10. The switch controller of claim 1, further comprising full-duty detection circuitry configured to determine whether a present duty of the power switch is full-duty based on the sum signal and a predetermined full-duty reference voltage at a predetermined duty threshold time point that corresponds to a maximum duty period of the power switch.

11. The switch controller of claim 1, further comprising full-duty detection circuitry configured to determine whether a present duty of the power switch is full-duty based on the sum delay signal and a full-duty reference ramp voltage increasing with a predetermined slope at a predetermined duty threshold time point that corresponds to a maximum duty period of the power switch.

12. The switch controller of claim 1, further comprising full-duty detection circuitry configured to determine whether a present duty of the power switch is full-duty based on the sum signal and a full-duty reference ramp voltage increasing with a predetermined slope at a predetermined duty threshold time point that corresponds to a maximum duty period of the power switch.

13. A switch control method comprising:
receiving a sense voltage of a sense resistor configured to receive a drain current of a power switch;
generating a sum signal based on the sense voltage and a ramp signal having a cycle that is the same as a switching cycle of the power switch; and
determining a short circuit condition of the sense resistor by detecting slope variation of the sum signal;
wherein determining the short circuit condition comprises:
detecting a negative slope of the sum signal according to a comparison result of the sum signal and at least one sum delay signal delayed by at least one predetermined delay period from the sum signal.

14. The switch control method of claim 13, wherein the determining of the short circuit condition comprises:
counting a clock signal that controls a switching frequency of the power switch;
detecting a negative slope of the sum signal according to a comparison result of the sum signal and the sum delay signal;
resetting the count result when the negative slope is detected; and
determining the sense resistor to be short-circuited when the count result reaches a predetermined threshold value.

15. The switch control method of claim 14, wherein detecting the negative slope of the sum signal comprises:
generating a count reset signal according to the comparison result of the sum signal and the sum delay signal, and
detecting the second pulse of the count reset signal with the negative slope during a maximum duty period of the power switch.

16. A power supply comprising:
a power switch;
inductor circuitry coupled between the power switch and an input voltage;
sense resistor circuitry coupled between the power switch and a reference potential; and
switch controller circuitry configured to generate a sum signal based on a sense voltage generated by the sense resistor circuitry and a ramp signal generated based on a clock signal that determines a switching frequency of the power switch, the switch controller circuitry is further configured to determine whether the sense resistor is in a short circuit condition by detecting slope variation of the sum signal;
wherein the switch controller circuitry is further configured to detect a negative slope of the sum signal based on the sum signal and at least one sum delay signal, wherein the at least one sum delay signal has at least one predetermined delay period from the sum signal.

17. The power supply of claim 16, wherein the switch controller circuitry is further configured to reset a counting result of a clock signal that controls the switching frequency of the power switch when a negative slope of the sum signal is detected.

18. The power supply of claim 17, wherein the switch controller circuitry is further configured to turn off the power switch when the counting result reaches a predetermined threshold value.

19. The power supply of claim 18, wherein the switch controller circuitry is further configured to count the clock signal, and reset the count result based on a second pulse of the count reset signal during a maximum duty period of the power switch.

20. The power supply of claim 16, wherein the switch controller circuitry is further configured to reset the counting result of clock signal that controls switching frequency of the power switch when a negative slope of the sum signal is determined based on a first sum delay signal delayed by a predetermined first delay period from the sum signal and a second sum delay signal delayed by a predetermined second delay period from the sum signal.

21. The power supply of claim 20, wherein the switch controller circuitry is further configured to turn off the power switch when the count result reaches a predetermined threshold value.

* * * * *